US009673395B2

(12) United States Patent
Lee et al.

(10) Patent No.: US 9,673,395 B2
(45) Date of Patent: Jun. 6, 2017

(54) APPARATUS AND METHOD FOR FORMING ORGANIC THIN FILM AND MANUFACTURING METHOD OF ORGANIC THIN FILM DEVICE USING THE SAME

(71) Applicant: AMOGREENTECH CO., LTD., Gimpo-si (KR)

(72) Inventors: Jin Hyoung Lee, Incheon (KR); Geun Sik Cho, Incheon (KR); Il Soo Moon, Suwon-si (KR); Yong Sul Song, Seoul (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 34 days.

(21) Appl. No.: 14/715,878

(22) Filed: May 19, 2015

(65) Prior Publication Data
US 2015/0263286 A1    Sep. 17, 2015

Related U.S. Application Data

(62) Division of application No. PCT/KR2013/010616, filed on Nov. 21, 2013.

(30) Foreign Application Priority Data

Nov. 23, 2012  (KR) .................. 10-2012-0133720
Nov. 23, 2012  (KR) .................. 10-2012-0133729

(51) Int. Cl.
B05B 7/16     (2006.01)
B05C 11/10    (2006.01)
(Continued)

(52) U.S. Cl.
CPC ...... H01L 51/0007 (2013.01); H01L 51/0003 (2013.01); H01L 51/0008 (2013.01);
(Continued)

(58) Field of Classification Search
CPC ....................................... B05B 7/16

USPC ... 118/300, 302, 666, 667, 712, 692, 62, 63; 239/13, 135
See application file for complete search history.

(56) References Cited

U.S. PATENT DOCUMENTS 4,179,068 A * 12/1979 Dombrowski ........ B05B 7/0433
                                                239/129
4,771,946 A *  9/1988 Moy ....................... B05B 5/025
                                                118/302
(Continued)

FOREIGN PATENT DOCUMENTS

JP   1998202153   8/1998
JP   2002208579   7/2002
(Continued)

OTHER PUBLICATIONS

International Search Report—PCT/KR2013/010616 dated Mar. 13, 2014.
(Continued)

Primary Examiner — Yewebdar Tadesse
(74) Attorney, Agent, or Firm — Cantor Colburn LLP

(57) ABSTRACT

Provided is an organic thin film forming apparatus, an organic thin film forming method, and a method of manufacturing an organic thin film device using the same, in which an organic light-emitting layer (photoactive layer) and/or an electron transport layer can be formed on a substrate when an organic light emitting diode (OLED) or an organic solar cell is manufactured. The organic thin film forming apparatus includes: a solution spray unit for spraying a solution on a substrate; and a hot gas spray unit for spraying a hot gas onto fine liquid droplets that have been sprayed from the solution spray unit and that are in flight, to thereby evaporate a solvent contained in the fine liquid droplets.

4 Claims, 10 Drawing Sheets

(51) Int. Cl.
    *H01L 51/00* (2006.01)
    *H01L 51/56* (2006.01)
    *H01L 51/52* (2006.01)
    *H01L 51/50* (2006.01)

(52) U.S. Cl.
    CPC ...... *H01L 51/0029* (2013.01); *H01L 51/5072* (2013.01); *H01L 51/5092* (2013.01); *H01L 51/5206* (2013.01); *H01L 51/5221* (2013.01); *H01L 51/56* (2013.01); *B05B 7/16* (2013.01); *H01L 51/0097* (2013.01); *H01L 51/5012* (2013.01); *H01L 51/5056* (2013.01); *H01L 2251/5338* (2013.01); *Y02E 10/549* (2013.01); *Y02P 70/521* (2015.11)

(56) References Cited

U.S. PATENT DOCUMENTS

| | | | | |
|---|---|---|---|---|
| 6,488,773 B1 * | 12/2002 | Ehrhardt | ............... | B05B 7/0807 118/302 |
| 6,565,010 B2 * | 5/2003 | Anderson | ............... | B05B 7/066 239/13 |
| 7,479,205 B2 | 1/2009 | Okuda et al. | | |
| 8,384,071 B2 | 2/2013 | Yang et al. | | |
| 2004/0043140 A1 * | 3/2004 | Jagannathan | ....... | H01L 51/0003 427/66 |

FOREIGN PATENT DOCUMENTS

| | | |
|---|---|---|
| JP | 2005125169 | 5/2005 |
| KR | 1020110128605 | 11/2011 |
| KR | 1020120031582 | 4/2012 |
| KR | 1020120032114 | 4/2012 |

OTHER PUBLICATIONS

Stephan Rauschenbach et al., Electrospray Ion Beam Deposition of Clusters and Biomolecules, small, 2006, pp. 540-547.

\* cited by examiner

<HEATING TEMPERATURE OF SUBSTRATE -130°C & HEATING TEMPERATURE OF GAS -100°C>

APPARATUS AND METHOD FOR FORMING ORGANIC THIN FILM AND MANUFACTURING METHOD OF ORGANIC THIN FILM DEVICE USING THE SAME

TECHNICAL FIELD

The present invention relates to an organic thin film forming apparatus, an organic thin film forming method, and a method of manufacturing an organic thin film device using the same, and more particularly, to an organic thin film forming apparatus and method, and a method of manufacturing an organic thin film device using the same, in which an organic thin film having a uniform thickness can be formed on a flexible substrate or on a substrate having a three-dimensional curvature by using a spray method or a hot gas injection method, to thus improve precision of the surface roughness of the organic thin film.

BACKGROUND ART

In general, OLEDs (Organic Light Emitting Diodes) have the advantages of low power consumption, fast response time, wide viewing angle, and so on. The OLEDs have a simple basic structure and can be easily manufactured, and thus are used for ultra-thin, ultra-light weight display units of 1 mm or less thick. Further, the OLEDs are fabricated on flexible substrates such as plastic substrates instead of glass substrates, and thus are also used in thinner, lighter, and unbreakable flexible display devices.

The OLED is formed of a multi-layered organic thin film including an anode electrode, a hole transport layer, an organic light-emitting layer, an electron transport layer, an electron injection layer, and a cathode electrode.

In addition, an organic solar cell is formed of a multi-layered organic thin film including an anode electrode, a hole transport layer, a photoactive layer, an electron transport layer, an electron injection layer, and a cathode electrode.

It has been widely known that the OLED and the organic solar cell having such a configuration, are formed by using a vacuum deposition method to form an organic thin film such as a hole transport layer, an organic light-emitting layer (or a photoactive layer), an electron injection layer and an electron transport layer.

When manufacturing an organic thin film by a sputtering or vacuum deposition process, a vacuum chamber is required. Accordingly, a manufacturing process thereof is complicated, a production cost therefor is very expensive, it is difficult for mass production thereof, it is not suitable for manufacturing a flexible OLED, and its application range is not wide.

The electron injection layer is formed by depositing an organic ultra-thin film of about 1 nm made of LiF, CsF, NaF, or $Cs_2CO_3$ or a layer of about 20 nm made of Ca, Li, Ba, Cs, or Mg. However, such an electron injection layer is highly susceptible to oxygen and moisture in the outside air even during further deposition of a negative electrode, to accordingly have a serious problem of shortening the lifetime of a device, and making it difficult to handle these materials during a manufacturing process.

In addition, since an organic ultra-thin film electron injection layer uses an organic thin film of 0.5~2 nm thick in an electron injection layer/cathode structure such as a LiF/Al structure which is the most widely used, the surface condition of a coating film of an underlying layer is very important in which the organic ultra-thin film electron injection layer is deposited on the underlying layer.

Therefore, since it is not easy to have a sufficient coating performance by using a solution process such as a roll-to-roll printing process, an ink jet printing process, a screen printing process, a spray coating process, or a dip coating process, it is very difficult to apply the organic ultra-thin film electron injection layer to the solution process.

To solve this problem, development of an organic thin film forming apparatus using a spray method has been currently actively conducted in order to form an organic thin film by spraying a solution on a substrate with the spray method.

As disclosed in Korean Patent Publication 10-1172187 on Aug. 27, 2012, a method of producing an organic thin film transistor using a conventional spray method includes the steps of: preparing a substrate; manufacturing a solution to be deposited on the substrate; placing a shadow mask on the substrate, in which a pattern is formed on the shadow mask; coating the manufactured solution on the shadow mask through a spray device; and evaporating a remaining solvent by performing heat treatment after terminating the coating step.

Such a method of manufacturing an organic thin film transistor using a conventional spray method may form a uniform organic thin film because of using the spray method, but requires a separate heat treatment apparatus and a heat treatment process since the solvent contained in the solution is evaporated through a separate high temperature heat treatment after having applied the solution on the substrate, to thereby cause the manufacturing process to become complicated and the manufacturing cost to increase.

Also, conventionally, because a high temperature heat treatment is performed in a state where a solution is applied on a substrate to control a volatilization rate of a solvent, the substrate or thin film (solute) may cause a thermal damage by high temperature. In addition, when a thermal expansion coefficient difference between the substrate and the thin film is large, the applied thin film may peel off from the substrate. In addition, when the temperature of the substrate increases, and thus the solvent is rapidly evaporated, closed pores may be generated in the thin film, and thus the solvent in the pores is not sufficiently evaporated, or when the solvent is rapidly evaporated, the surface roughness of the organic thin film becomes high.

Furthermore, since the conventional spray method may cause a thin film which is already deposited on the substrate to be dissolved by the solvent contained in the injected liquid droplets, there may be problems of lowering uniformity of the thickness of the thin film and increasing the surface roughness of the thin film.

Technical Problem

To solve the above problems or defects, it is an object of the present invention to provide an organic thin film forming apparatus and method, and a method of manufacturing an organic thin film device using the same, in which thickness of the organic thin film can be made thin, and thickness of the organic thin film can be controlled, in particular, uniform thickness of the organic thin film can be formed on a surface of a flexible substrate, and a substrate having a three-dimensional curvature, by spraying a hot gas to evaporate a solvent when a solution is sprayed in a spraying method to thus form an organic thin film, and when the sprayed fine liquid droplets are in flight.

In addition, it is another object of the present invention to provide an organic thin film forming apparatus and method, and a method of manufacturing an organic thin film device using the same, in which precision of the surface roughness of an organic thin film applied on a substrate can be improved by spraying a hot gas onto fine liquid droplets to thus evaporate a solvent when a solution is sprayed from a nozzle and then is in flight, and a separate heat treatment process is not required for evaporation of the solvent to thus reduce a manufacturing process thereof.

In addition, it is another object of the present invention to provide an organic thin film forming apparatus and method, and a method of manufacturing an organic thin film device using the same, in which it is unnecessary to heat a substrate or it is necessary to heat a substrate at a low temperature, by spraying a hot gas onto fine liquid droplets to thus evaporate most of a solvent contained in the fine liquid droplets when a solution is sprayed a nozzle and then is in flight, and to thereby be able to use a flexible substrate to thus make it possible to produce a flexible organic light emitting diode (OLED) and an organic solar cell.

The technical problems to be solved in the present invention are not limited to the above-mentioned technical problems, and the other technical problems that are not mentioned in the present invention may be apparently understood by one of ordinary skill in the art in the technical field to which the present invention belongs.

Technical Solution

To accomplish the above and other objects of the present invention, according to an aspect of the present invention, there is provided an organic thin film forming apparatus that forms at least one of an organic light-emitting layer (photoactive layer) and an electron transport layer can be formed on a substrate, the organic thin film forming apparatus comprising: a solution spray unit for spraying a solution on a substrate, to thereby form an organic thin film; and a hot gas spray unit for spraying a hot gas onto fine liquid droplets that have been sprayed from the solution spray unit and that are in flight, to thereby evaporate a solvent contained in the fine liquid droplets.

Preferably but not necessarily, the solution spray unit comprises: a supply unit connected to a storage tank in which the solution is stored, to thus supply the solution spray unit with the solution; and a spray nozzle that is attached to a lower side of the supply unit and for spraying the solution on a surface of the substrate, wherein the spray unit employs any one of an air spray method, an electric spray method, and a hybrid spray method adopting both the air spray method and the electric spray method.

Preferably but not necessarily, the hot gas spray unit comprises: a housing that is attached to an outer surface of the spray nozzle, and that has a space portion through which a hot gas flows in, and a spray passage through which the hot gas is sprayed and that is formed at a lower side of the housing; a pipe that is connected to one side of the housing and through which the hot gas passes; and a heating unit that is provided on the pipe and that heats the gas supplied through the pipe.

Preferably but not necessarily, the organic thin film forming apparatus further comprises a controller for controlling a current pressure and a current temperature of the hot gas sprayed from the hot gas spray unit, and wherein the controller comprises: an input unit for inputting a set temperature and a set pressure under an operation of a user; a temperature sensor for measuring the current temperature of the hot gas; a pressure sensor for measuring the current pressure of the hot gas; and a control unit for controlling a heating unit to heat the hot gas and a pressure control unit to control the current pressure of the hot gas, on the basis of data input from the input unit, the temperature sensor and the pressure sensor.

According to another aspect of the present invention, there is also provided a method of manufacturing an organic thin film device comprising the steps of: preparing a transparent substrate having flexibility; forming an anode electrode on the substrate; forming a hole transport layer on the anode electrode; forming an organic light emitting layer or a photoactive layer on the hole transport layer; forming an electron transport layer on the organic light emitting layer or the photoactive layer; forming an electron injection layer on the electron transport layer; and forming a cathode electrode on the electron injection layer.

Preferably but not necessarily, the organic thin film device comprises an organic light emitting diode or an organic solar cell.

Preferably but not necessarily, at least one step of the steps of forming the hole transport layer and forming the organic light emitting layer or the photoactive layer is formed of a spray method, wherein the spray method comprises the sub-steps of: setting a pressure and temperature of a hot gas, depending on a type of a solvent contained in a solution; spraying the solution from a solution spray unit; spraying a hot gas to fine liquid droplets that have been sprayed from the solution spray unit and are in flight, to thus evaporate the solvent contained in the fine liquid droplets; and forming an organic thin film in which the fine liquid droplets are deposited on a surface of the substrate.

According to another aspect of the present invention, there is also provided a method of forming an organic thin film comprising the steps of: preparing a spray solution; setting a pressure and temperature of a hot gas, depending on a type of a solvent contained in the solution; spraying the solution from a solution spray unit; spraying the hot gas to fine liquid droplets that have been sprayed from the solution spray unit and are in flight, to thus evaporate the solvent contained in the fine liquid droplets; and forming an organic thin film in which the fine liquid droplets are deposited on a surface of the substrate.

Advantageous Effects

As described above, an organic thin film forming apparatus and method, and a method of manufacturing an organic thin film device using the same, according to the present invention are configured to spray a hot gas onto fine liquid droplets to evaporate a solvent, when a solution is sprayed in a spraying method, the solution is sprayed from a spray nozzle and the sprayed fine liquid droplets are in flight, in which thickness of the organic thin film can be made thin, and thickness of the organic thin film can be controlled, in particular, uniform thickness of the organic thin film can be formed on a surface of a flexible substrate, and a substrate having a three-dimensional curvature.

In addition, an organic thin film forming apparatus and method, and a method of manufacturing an organic thin film device using the same, according to the present invention are configured to improve precision of the surface roughness of an organic thin film applied on a substrate by spraying a hot gas onto fine liquid droplets to thus evaporate a solvent when a solution is sprayed from a nozzle and then is in flight, and to have no need of a separate heat treatment process for evaporation of the solvent to thus reduce a manufacturing process thereof.

In addition, an organic thin film forming apparatus and method, and a method of manufacturing an organic thin film device using the same, according to the present invention are configured to make it unnecessary to heat a substrate or make it necessary to heat a substrate at a low temperature, by spraying a hot gas onto fine liquid droplets to thus evaporate most of a solvent contained in the fine liquid droplets when a solution is sprayed a nozzle and then is in flight, and to thereby be able to use a flexible substrate to thus make it possible to produce a flexible organic light emitting diode (OLED) and an organic solar cell.

[Reference Numbers]

Figure 1:
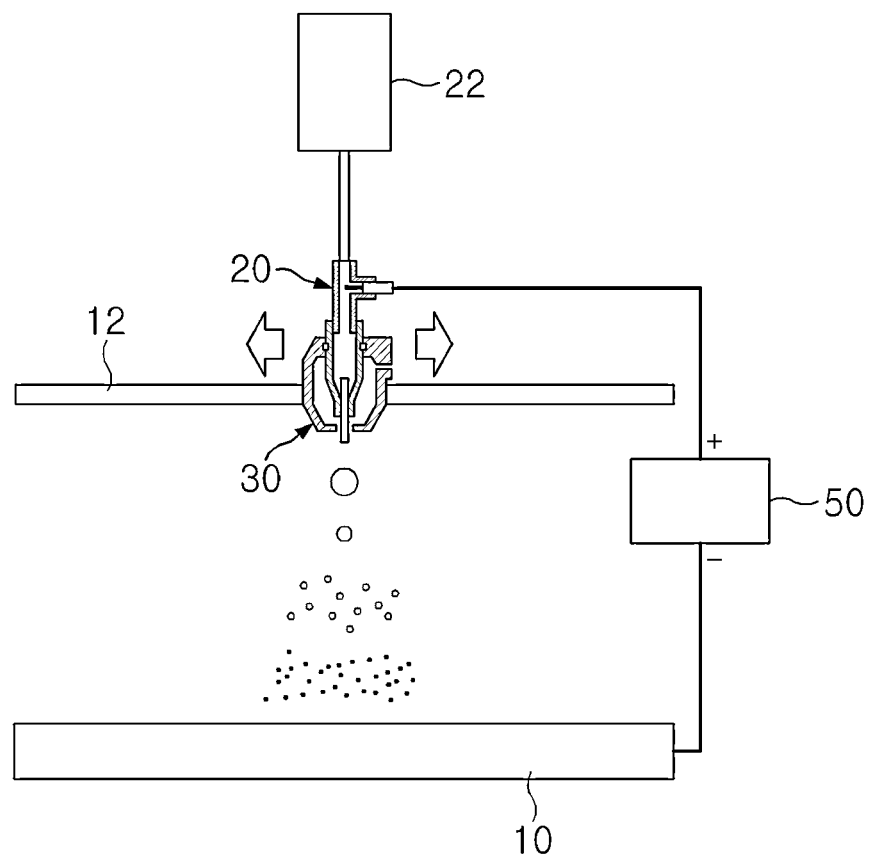
FIG. 1 is a schematic diagram of an organic thin film forming apparatus according to an embodiment of the present invention.

| | |
|---|---|
| 10: substrate | 12: moving unit |
| 20: solution spray unit | 22: storage tank |
| 24: supply unit | 26: spray nozzle |
| 28: electric conductor nozzle | 30: hot gas spray unit |
| 32: space portion | 34: housing |
| 36: spray unit | 40: pipe |
| 42: heating unit | 44: pressure adjusting unit |
| 50: high voltage generator | 60: control unit |
| 62: temperature sensor | 64: pressure sensor |
| 66: input unit | |

BEST MODE

Embodiments of the present invention will be described below in detail with reference to the accompanying drawings. Here, the size or shape of the components illustrated in the drawings may be shown to be exaggerated for convenience and clarity of illustration. In addition, specifically defined terms may be changed according to the intention or practices of users or operators in consideration of the construction and operation of the present invention. The definition of the terms should be made based on contents throughout the present specification.

Figure 2:
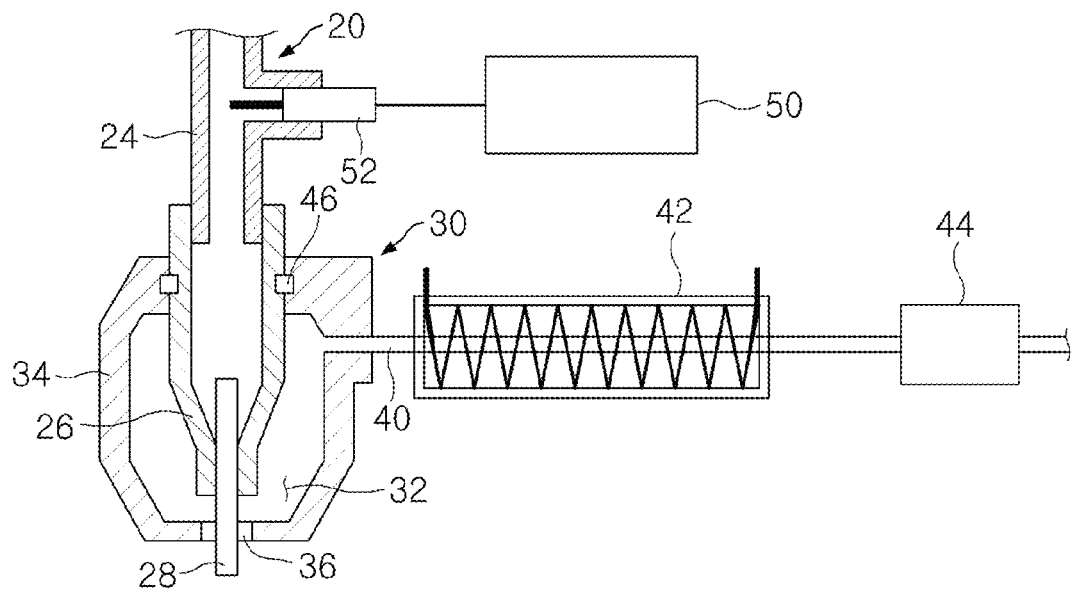
FIG. 2 is a cross-sectional view of an organic thin film forming apparatus according to an embodiment of the present invention.

FIG. 1 is a schematic diagram of an organic thin film forming apparatus according to an embodiment of the present invention, and FIG. 2 is a cross-sectional view of an organic thin film forming apparatus according to an embodiment of the present invention.

Referring to FIGS. 1 and 2, the organic thin film forming apparatus according to an embodiment of the present invention may be used to manufacture organic light emitting diodes (OLEDs), and organic solar cells, and includes a solution spray unit 20 for spraying a solution on a substrate 10, to thereby form an organic thin film; and a hot gas spray unit 30 for spraying a hot gas onto fine liquid droplets that have been sprayed from the solution spray unit 20 and that are in flight, to thereby evaporate a solvent contained in the fine liquid droplets.

The OLED is formed of a multi-layered organic thin film including an anode electrode, a hole transport layer, an organic light-emitting layer, an electron transport layer, an electron injection layer, and a cathode electrode. In addition, the organic solar cell is formed of a multi-layered organic thin film including an anode electrode, a hole transport layer, a photoactive layer, an electron transport layer, an electron injection layer, and a cathode electrode.

The organic thin film forming apparatus according to an embodiment is configured to form an organic thin film such as such as a hole transport layer, an organic light-emitting layer (or a photoactive layer), an electron injection layer, or an electron transport layer on a substrate when manufacturing an OLED and an organic solar cell.

The solution spray unit 20 is disposed at a predetermined distance from the top surface of the substrate 10, and is configured to evenly distribute the solution sprayed from the solution spray unit 20 onto the surface of the substrate 10. In addition, the solution spray unit 20 can be moved in the left-right direction or both in the left-right direction and in the front-rear direction on the top surface of the substrate 10 by a moving unit 12.

A variety of substrates such as a substrate whose surface is of a planar shape, a substrate with a three-dimensional curvature, a flexible substrate, or a substrate that is relatively weak to heat can be applied in the present invention.

The substrate 10 may be provided with a heater (not shown) for heating the substrate 10 to evaporate the solvent remaining in fine liquid droplets deposited on the substrate. In other words, the solvent contained in fine liquid droplets is primarily evaporated by the hot gas spray unit 30, and the solvent that has not been evaporated by the hot gas spray unit 30 but still remains in fine liquid droplets is finally evaporated by heating the substrate 10 by the heater (not shown) provided in the substrate 10.

In this case, since most of the solvent is evaporated by the hot gas spray unit 30, the amount of the solvent contained in the solution (that is, the fine liquid droplets) applied onto the substrate 10 is very little. Thus, the heating temperature of the substrate 10 may not be high. Thus, since the heating temperature of the substrate 10 is relatively low in the present embodiment, the substrate weak in heat is available.

Here, the heating temperature of the substrate 10 is preferably set to 70~180° C.

The solution spray unit 20 includes: a supply unit 24 connected to a storage tank 22 in which the solution is stored, to thus supply the solution spray unit 20 with the solution; and a spray nozzle 26 that is attached to a lower side of the supply unit 24 and for spraying the solution on a surface of the substrate 10.

Here, the solution spray unit 20 employs any one of an air spray method, an electric spray method, and a hybrid spray method adopting both the air spray method and the electric spray method.

The solution may be used by mixing a solute and a solvent in a ratio suitable to spray the solution, the solute may employ an organic material, a polymer, an inorganic material, a metal-based organic polymer and a mixture of one or more thereof, so as to be capable of forming an organic thin film, and the solvent may employ a volatile solvent has a volatility such as water, benzene-based, alcohol-based, or chloroform may be used.

The upper end of the supply unit 24 is sealably connected to the storage tank 22 and the bottom of the supply unit 24 is sealably connected to the spray nozzle 26. In addition, when adopting the electric spray method, a plus terminal 52 connected to a high voltage generator 50 is mounted at one side of the supply unit 24 so as to charge the solution.

That is, in the case of the electric spray method, a high voltage generated from high voltage generator 50 is applied between the solution spray unit 20 and the substrate 10. Accordingly, the solution is sprayed from the solution spray unit 20 to then be applied onto the surface of the substrate 10.

The spray nozzle 26 is formed so that the inner diameter of the spray nozzle 26 gets narrower as it goes to the downward direction. In the case of the electric spray method, an electric conductor nozzle tip 28 is provided at the end of the spray nozzle 26 in order to charge the applied solution.

Here, the voltage applied between the solution spray unit 20 and the substrate 10 is set to be 8~14 kV, a distance between the solution spray unit 20 and the substrate 10 is set to be 6~12 cm, and a solution discharge rate is set to be 40~1000 ul/min.

The hot gas spray unit includes: a housing 34 that is attached to an outer surface of the spray nozzle 26, and that has a space portion 32 through which the hot gas flows in, and a spray passage 36 through which the hot gas is sprayed and that is formed at a lower side of the housing 34; a pipe 40 that is connected to one side of the housing 34 and through which the hot gas flows in the space portion 32; and a heating unit 42 that is provided on the pipe 40 and that heats the gas that passes through the pipe 40.

Any structure to heat the gas passing through the pipe 40 can be applied as the heating unit 42. Then, any heating method selected from among a heating method by conduction, a heating method by convection, and a heating method by radiation can be applied as a gas heating method.

For example, a heating unit 42 is composed of a heating coil disposed to surround the outer peripheral surface of the pipe 40, and thus employs the gas heating method that heats the gas that passes through the pipe 40 by applying electric power to the heating coil.

Then, the pipe 40 is connected to a gas storage tank (not shown) in which the gas is stored. In addition, a pressure adjusting unit 44 is provided along the pipe 40 to control the spraying pressure of the gas stored in the gas storage tank.

Here, air, nitrogen, oxygen, inert gas and a gas mixture mixed with at least two or more thereof may be used as the gas.

The housing 34 is attached with a predetermined gap to the outer surface of the spray nozzle 26, and the space portion 32 is formed between the inner surface of the housing 34 and the outer surface of the spray nozzle 26. Thus, the hot gas introduced into the space portion 32 is brought into contact directly with the outer surface of the spray nozzle 26, thereby heating the solution passing through the spray nozzle 26.

In this way, the hot gas spray unit 30 heats the solution passing through the spray nozzle 26, to thus make the solution maintain the appropriate viscosity for spraying, and to thereby improve the spray performance of the solution.

A seal ring 46 is mounted at one side of the housing 34 coupled to the spray nozzle 26, to thus maintain airtightness between the housing 34 and the spray nozzle 26.

In addition, an end 28 of the spray nozzle 26 passes through a center portion of the spray passage 36 formed in the lower side of the housing 34, to thus make the hot gas spray unit 30 spray the hot gas in a state of wrapping the spray nozzle 26. Therefore, since the hot gas is sprayed in a form of wrapping the outside of the solution sprayed from the spray nozzle 26, the solvent contained in the solution can be accurately evaporated.

In addition, the hot gas is sprayed in the same direction as the solution sprayed from the spray nozzle 26, to thereby give linearity to the fine liquid droplets. As a result, the fine liquid droplets are prevented from flying, and the solution is also sprayed at the correct position of the substrate. Accordingly, the thickness of the organic thin film can be formed more uniformly.

The gas pressure is preferably set to be approximately 0.04~0.12 MPa, and the gas temperature is preferably set to be approximately 80~150° C.

Here, if the pressure of the gas is not more than 0.06 MPa, the gas pressure is too low to evaporate the solvent, but if the pressure of the gas is at least 0.12 MPa, the gas pressure is too high to spray the solvent onto the substrate. Then, when the gas temperature is equal to or less than 80° C., the solvent is not evaporated, and when the gas temperature is more than 150° C., the solute may be damaged.

Figure 3:
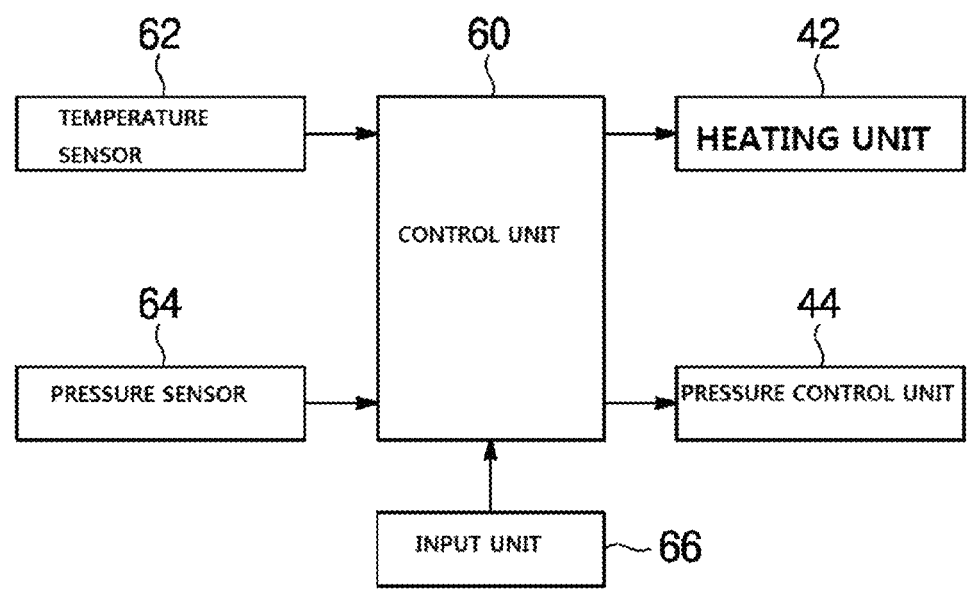
FIG. 3 is a block diagram of a controller for controlling an organic thin film forming apparatus according to an embodiment of the present invention.

FIG. 3 is a block diagram of a controller for controlling an organic thin film forming apparatus according to an embodiment of the present invention.

The controller includes: an input unit 66 for inputting a set temperature of a gas and a set pressure of the gas under an operation of a user; a temperature sensor 62 that is provided at one side of the housing 34 and measures a current temperature of the hot gas introduced into the housing 34; a pressure sensor 64 that is provided at one side of the housing 34 and measures a current pressure of the hot gas; and a control unit 60 for controlling a heating unit 42 and a pressure control unit 44, on the basis of the set temperature and pressure input from the input unit 66, and data applied from the temperature sensor 62 and the pressure sensor 64.

When a user enters an optimum temperature and an optimum pressure suitable to evaporate the solvent as a user set temperature and a user set pressure, depending on the type and nature of the solvent contained in the solution, the control unit 60 sets the user set temperature and the user set pressure as reference values.

Then, the control unit 60 compares the current temperature and pressure applied from the temperature sensor 62 and the pressure sensor 64 with the reference values, and thus controls the heating unit 42 and the pressure control unit 44, in a manner that the temperature and pressure of the gas can be maintained in a range of the reference value.

The manufacturing process of the organic thin film device that is prepared according to the present invention, for example, the organic solar cell and the organic light emitting diode (OLED) will be described the in the following.

Figure 4:
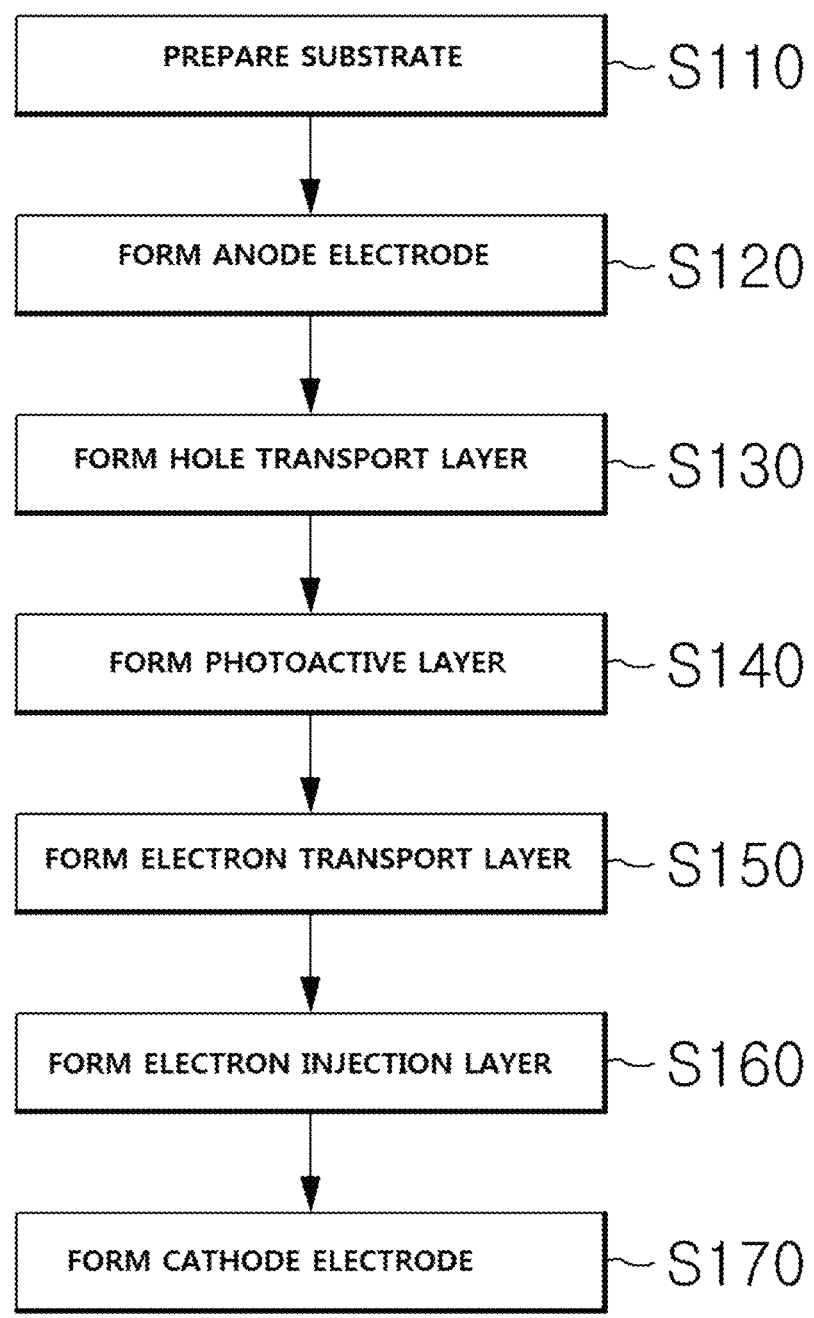
FIG. 4 is a flowchart view illustrating a manufacturing process of an organic solar cell according to an embodiment of the present invention.

FIG. 4 is a flowchart view showing an organic solar cell manufacturing method according to an embodiment of the present invention.

The organic solar cell manufacturing method will be described as follows.

First, a substrate is prepared (S110). The substrate is of a flexible form so as to have a flexibility, in which the flexible substrate is a three-dimensional substrate on which a plurality of irregularities are formed, and a transparent polymer film is used in the flexible substrate so that the light can be transmitted.

In addition, an anode electrode is formed on the surface of the substrate (S120). The anode electrode is formed of a light transmitting material through which the light transmits, uses a conductive metal material such as metal oxide such as indium tin oxide (ITO), and adopts a screen printing method, a sputtering method, a vacuum deposition method or the like.

The conductive polymer material includes a material that is obtained by adding any one of DMSO (dimethyl sulfoxide), PC (polycarbonates), DMF (dimethyl formamide), HMPA (hexamethyl phosphorotriamide), THF (tetrahydrofuran), EG (ethylene glycol), and NMP (N-Methyl-2-pyrrolidone) to PEDOT:PSS poly(3,4-ethylenedioxythiophene) polystyrene sulfonate.

In addition, a hole transport layer is formed on the anode electrode (S130). Here, the hole transport layer is formed by an organic thin film forming method using the organic thin film forming apparatus described above.

In other words, the solution for forming the hole transport layer is sprayed by the solution spray unit, and then the hot gas is sprayed by the hot gas spray unit onto the fine liquid droplets in flight, to thus evaporate the solvent. As a result, an organic thin film from which the solvent has been substantially removed is applied on the surface of the anode electrode, to thus form a hole transport layer. Here, the thickness of the hole transport layer is preferably set to be 50~150 nm.

In addition, in order to evaporate the solvent that has not been removed by the hot gas sprayed from the hot gas spray unit and still remains in the applied organic thin film, an annealing process is performed. In this annealing process, it is preferable to carry out the annealing for about 10 minutes at 130° C.

In addition, a photoactive layer is formed on the hole transport layer (S140). Here, the photoactive layer is formed by the organic thin film forming method using the organic thin film forming apparatus described above.

In other words, the solution for forming the photoactive layer is sprayed by the solution spray unit, and then the hot gas is sprayed by the hot gas spray unit onto the fine liquid droplets in flight, to thus evaporate the solvent. As a result, an organic thin film from which the solvent has been substantially removed is applied on the surface of the hole transport layer, to thus form the photoactive layer. Here, the thickness of the photoactive layer is preferably set to be 100~200 nm.

In addition, annealing of the photoactive layer is executed. In this annealing process, it is preferable to carry out the annealing for 24 hours at 75° C.

In addition, an electron transport layer is formed on the photoactive layer (S150). The electron transport layer can be formed by a vacuum deposition method. Then, an organic ion material is coated and doped on the electron transport layer, to form an electron injection layer (S160).

Finally, when a conductive metal layer is deposited on the electron transport layer thereby forming a cathode electrode, the organic solar cell is completely prepared (S170).

Figure 5:
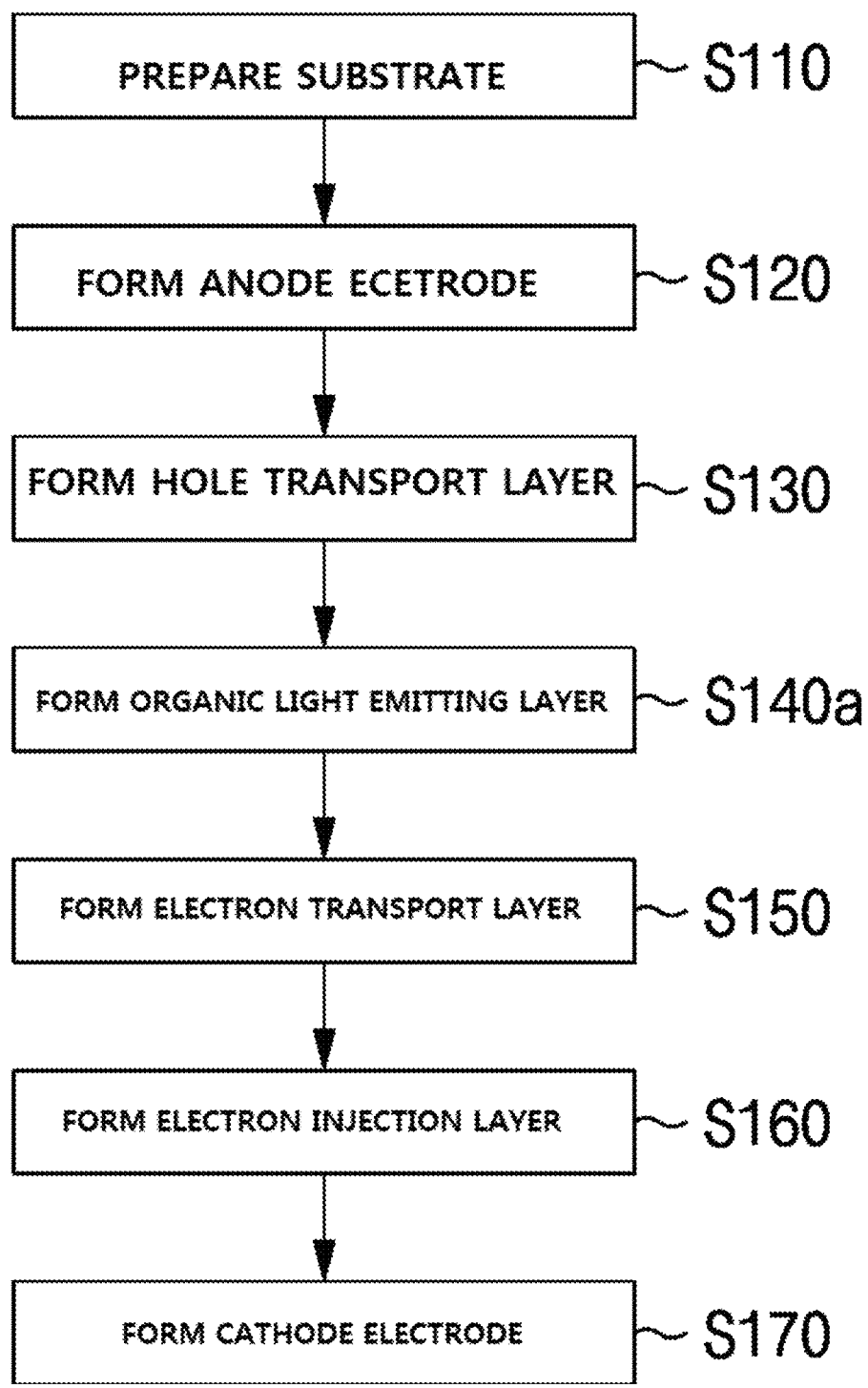
FIG. 5 is a flowchart view illustrating an organic light emitting diode (OLED) manufacturing process according to an embodiment of the present invention.

On the following, an organic light emitting diode (OLED) manufacturing method will be described with reference to FIG. 5. FIG. 5 is a flowchart illustrating a method of manufacturing an OLED according to the present invention.

The OLED manufacturing method is the same as the method of manufacturing the above organic solar cell, but a process (S140a) to form an organic light emitting layer will be performed in place of the process (S140) of forming the photoactive layer.

Here, the organic light emitting layer is formed by the organic thin film forming method using the organic thin film forming apparatus described above.

In other words, the solution for forming the organic light emitting layer is sprayed by the solution spray unit, and then the hot gas is sprayed by the hot gas spray unit onto the fine liquid droplets in flight, to thus evaporate the solvent. As a result, an organic thin film from which the solvent has been substantially removed is applied on the surface of the hole transport layer, to thus form the organic light emitting layer. Here, the thickness of the organic light emitting layer is preferably set to be 50~150 nm.

In this case, the organic light emitting layers for RGB may be separately sprayed by the solution spray unit, or may be mixed and sprayed.

Figure 6:
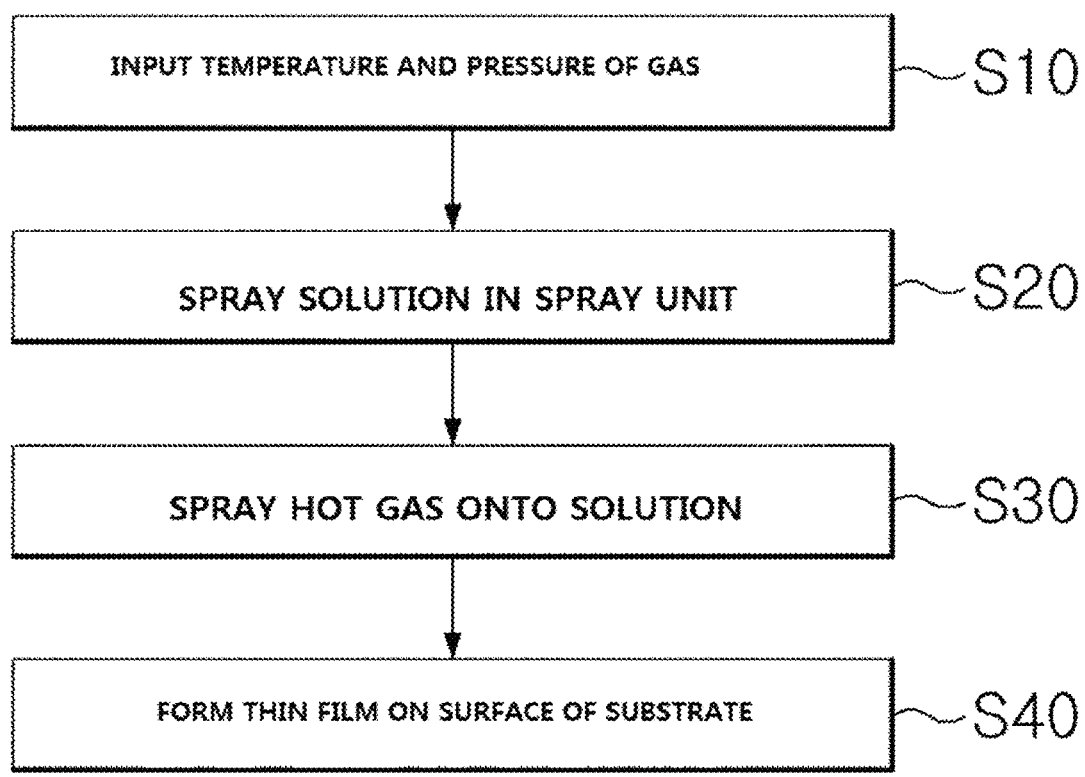
FIG. 6 is a flowchart view showing an organic thin film forming method according to an embodiment of the present invention.

FIG. 6 is a flow chart showing an organic thin film forming method according to an embodiment of the present invention.

A process of forming the organic thin film by using a spraying method when manufacturing the organic solar cell and OLED described above will be described in more detail.

First, a set pressure and a set temperature of a gas is input (S10). That is, the optimum temperature and pressure of the gas that can evaporate a solvent are input by a user, depending on the nature of the solution and the type of the solvent. Then, the control unit 60 controls the heating unit 42 to control the heating temperature of the gas and controls the pressure control unit 44 to control the spraying pressure of the gas.

Here, the gas pressure is preferably set to be 0.04~0.12 MPa, and the gas temperature is preferably set to be 80~150° C.

Then, when the pressure and temperature of the gas are completely input, the solution spray unit 20 is operated to spray the solution onto the surface of the substrate 10 (S20). In this case, other layers such as the anode electrode and the hole transport layer may be coated on the substrate 10.

When the spray unit employs the air spray method, the spray unit sprays air to the solution to generate a spray pressure. When the spray unit employs the electric spray method, the high-voltage generator 50 is turned on to apply a high voltage between the solution spray unit 20 and the substrate 10, to thereby charge the solution. When the spray unit employs the hybrid method, air is sprayed and simultaneously the high voltage is applied between the solution spray unit 20 and the substrate 10, to thus spray the solution.

Here, the applied voltage between the solution spray unit and the substrate is set to be 8~14 kV, the distance between the solution spray unit and the substrate is set to be 6~12 cm, and a discharge rate is set to be 40~1000 ul/min.

Thus, since the organic thin film is formed by spraying the solution on the substrate 10 by using the spraying method in the embodiment, it is possible to freely control the thickness of the organic thin film as well as to make the thickness of the organic thin film thin.

Then, before the solution is sprayed and the fine liquid droplets reach the substrate 10, that is, the hot gas is sprayed onto the fine liquid droplets that have been sprayed from the spray nozzle 26 and have been in flight, the solvent contained in the fine liquid droplets is evaporated (S30).

That is, the heating unit 42 is operated to thus heat the gas to a set temperature, and to thus control the pressure of the gas flowing through the pipe 40 to a set pressure by the pressure control unit 44. Then, the hot gas flowing into the housing 34 through the pipe 40 is sprayed through the spray passage 36 to thereby evaporate the solvent contained in the fine liquid droplets in flight.

Here, when the inner temperature of the housing 34 is measured by the temperature sensor 62, and the measured inner temperature is applied to the control unit 60, the control unit 60 compares the gas temperature applied from the temperature sensor 62 with the reference temperature, to thus control the heating unit 42 so that the gas temperature is maintained within the reference temperature range.

Here, when the pressure of the gas sprayed from the housing 34 is measured by the pressure sensor 64 and the measured pressure is applied to the control unit 60, the control unit 60 compares the gas pressure with the reference pressure, to thus control the pressure control unit 44 so that the gas pressure is maintained within the reference pressure range.

In addition, the substrate is heated at a relatively low temperature to evaporate the solvent that has not been removed by the hot gas spray unit and still remains in the fine liquid droplets.

Here, since the heating temperature of the substrate is 70~190° C., that is, the substrate can be at a relatively low temperature when compared to the existing heating temperature, a variety of substrates such as a flexible substrate, a substrate weak to heat, and a thin substrate can be used as the substrate, and the solute is prevented from being damaged.

In the case that the existing organic thin film forming apparatus heats the substrate to evaporate the solvent, the solvent is evaporated in a state that the solvent is applied onto the substrate, to thereby reduce the quality of the organic thin film, and the substrate should be heated to a temperature at which the solvent may be evaporated, to thereby cause a problem of making it difficult to use the substrate weak to heat.

Since the hot gas is directly sprayed onto the fine liquid droplets that have been sprayed by the spray nozzle and are in flight to thus evaporate the solvent in this embodiment, the solvent is substantially removed from the fine liquid droplets applied onto the substrate, to thus improve the surface precision of the organic thin film and to accordingly improve the quality of the product.

In addition, since it is not necessary to heat the substrate, the substrate weak in heat is also available. Since the substrate is heated for the purpose of evaporating the solvent remaining in the fine liquid droplets applied onto the substrate, the heating temperature does not have to be set so high, and thus the substrate weak to heat can be used.

Hereinafter, the present invention will be described in more detail with reference to the following Examples. However, the following Examples are nothing but the illustration of the invention, and are not limited to the scope of the invention.

EXAMPLE 1

First, Orgacon™ (Agfa, PEDOT:PSS) of 0.8 wt % as a conductive polymer was dissolved in the water, and filtered with syringe filters of 6 um and 0.8 um to have prepared a spray solution. Then, a substrate having a three-dimensional curvature was prepared.

The prepared spray solution was sprayed by using an organic thin film forming apparatus of a hybrid spray method of mixing an electric spray method and an air spray method, to thereby have prepared a nano-thin film.

That is, it was set so that the applied voltage was 12 kV, the nitrogen pressure was 0.1 MPa, the distance between the spray nozzle and the substrate was 6 cm, the discharge amount was 700 ul/min, the temperature of the substrate was 130° C., and the gas temperature was 100° C. Then, the solution spray unit was made to spray the solution, and simultaneously the hot gas spray unit was made to spray the hot gas onto the fine liquid droplets in flight, to thereby have formed a nano organic thin film on the surface of the substrate having a three-dimensional curvature.

Figure 7:
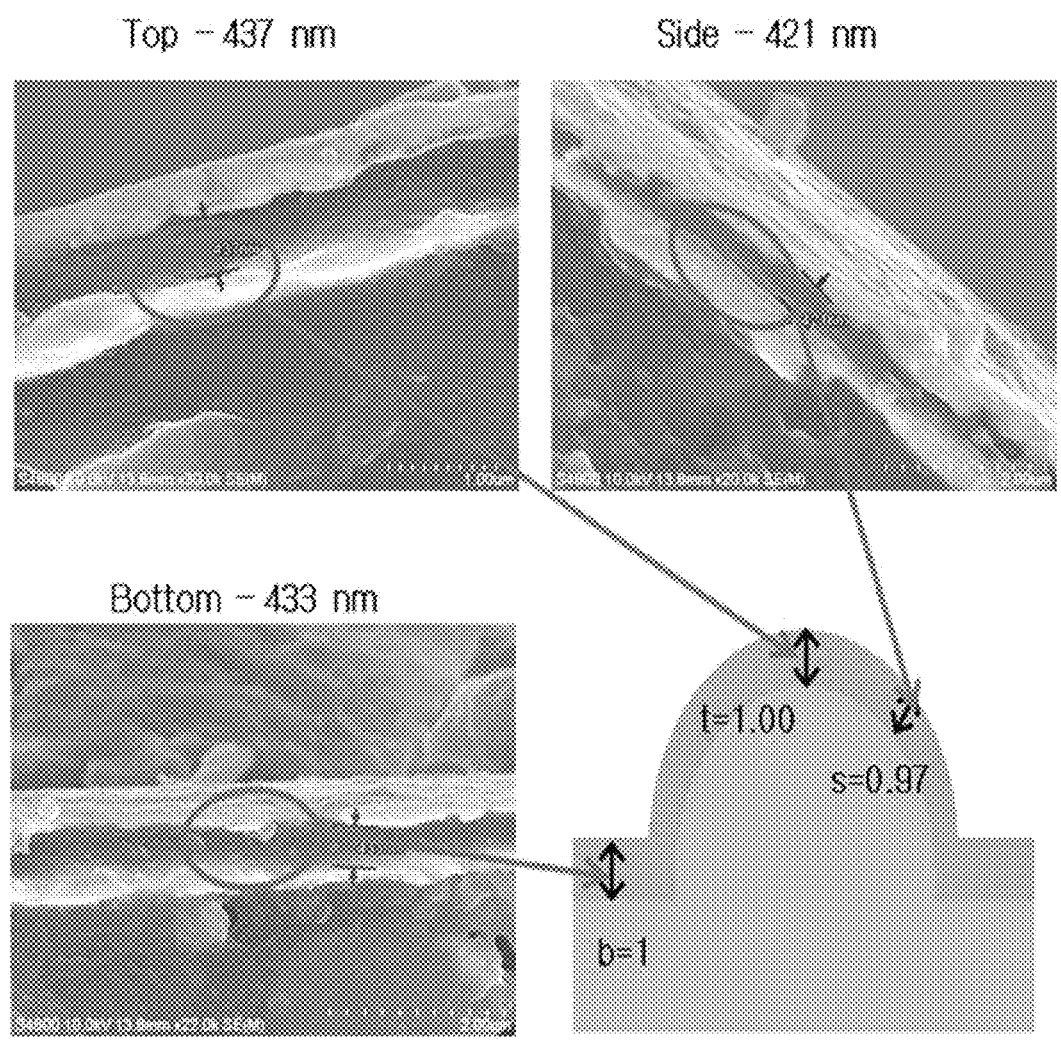
FIG. 7 shows three photos and a cross-section of an organic thin film fabricated by Example 1 of the present invention.

As three photos and a cross-section shown in FIG. 7, the nano organic thin film prepared by Example 1 was taken with a scanning electron microscope, and then the thicknesses of the top, side and bottom portions of the nano organic thin film were measured, in which the thickness of the top portion was 437 nm, the thickness of the side portion was 421 nm, and the thickness of the bottom portion was 433 nm. Thus, the ratio of the top portion with respect to the bottom portion was almost close to 1, and the ratio of the side portion with respect to the bottom portion was 0.97.

As in Example 1, the organic thin film was manufactured on the substrate having a three-dimensional curvature by using the organic thin film forming apparatus using the spray method according to the present invention. Accordingly, it could be confirmed that the organic thin film having a uniform thickness could be obtained as a whole, and the heating temperature of the substrate could be lowered.

EXAMPLE 2

As an OLED light emitting layer, PVK (Poly(9-vinylcabazole), PBD (2-(4-Biphenylyl)-5-phenyl-1,3,4-oxadiazole), and Ir(ppy)3(Tris[2-phenylpyridinato-C2, N]iridium III) were mixed at a ratio of 10:4:1, and the mixture was dissolved in monochlorobenzene at a ratio of 0.2 wt % to have prepared a spray solution.

The prepared solution was filtered with syringe filters of 6 um and 0.4 um, and then a nano thin film was manufactured by using the organic thin film forming apparatus of the hybrid spray method of mixing the electric spray method and the air spray method.

That is, it was set so that the applied voltage was 10 kV, the nitrogen pressure was 0.06 MPa, the distance between the spray nozzle and the substrate was 6 cm, the discharge amount was 88 ul/min, the temperature of the substrate was 130° C., and the gas temperature was 100° C. Then, the solution spray unit was made to spray the solution, and simultaneously the hot gas spray unit was made to spray the hot gas of 100° C. onto the fine liquid droplets in flight, to thereby have formed a nano organic thin film on the surface of the substrate having a three-dimensional curvature. In addition, the organic thin film sprayed on the substrate was processed for 24 hours by using a drying oven at 75° C., to thereby have carried out cross-linking.

Figure 8:
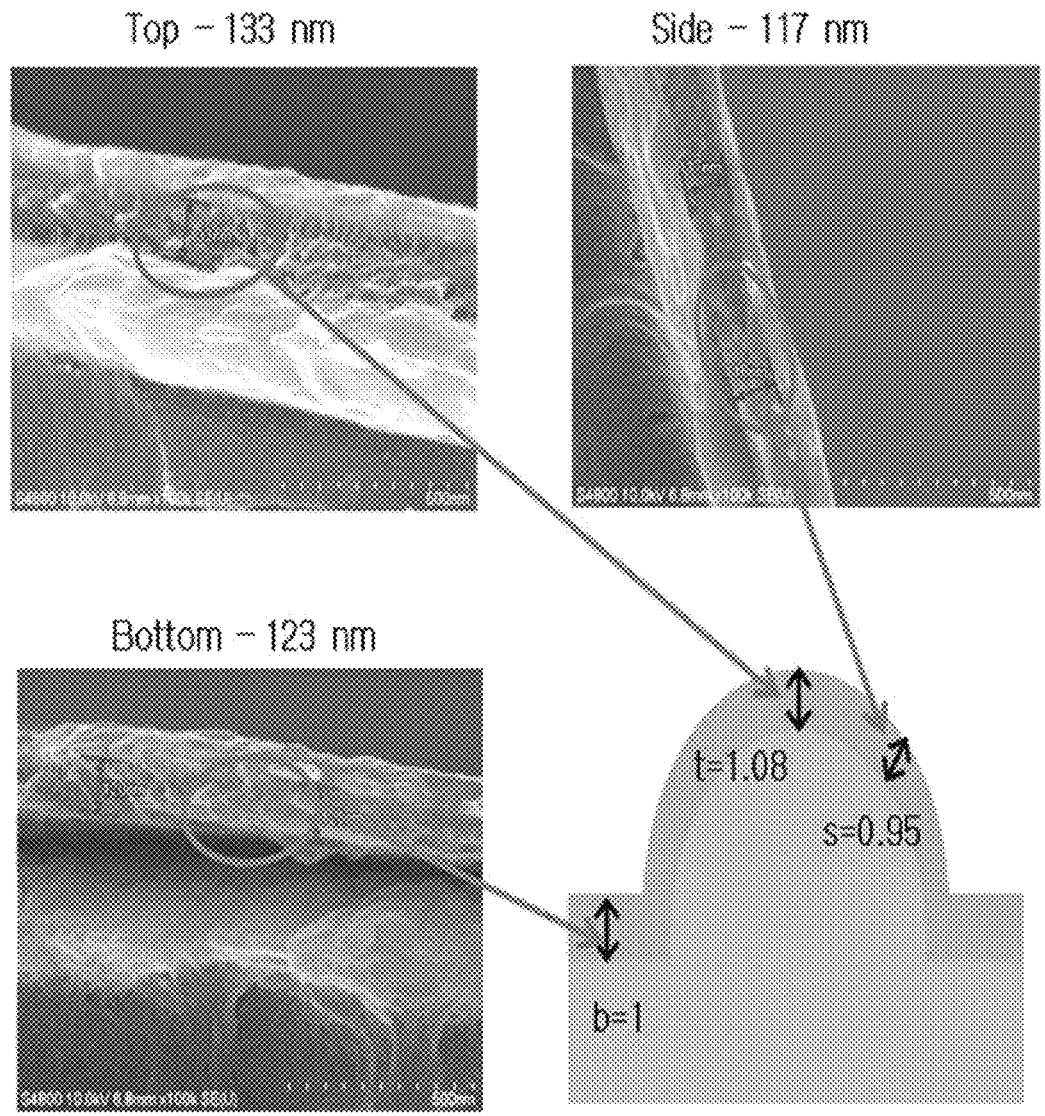
FIG. 8 shows three photos and a cross-section of an organic thin film prepared by Example 2 of the present invention.

As three photos and a cross-section shown in FIG. 8, the nano organic thin film prepared by Example 2 was taken with a scanning electron microscope, and then the thicknesses of the top, side and bottom portions of the nano organic thin film were measured, in which the thickness of the top portion was 133 nm, the thickness of the side portion was 117 nm, and the thickness of the bottom portion was 123 nm. Thus, the ratio of the top portion with respect to the bottom portion was 1.18, and the ratio of the side portion with respect to the bottom portion was 0.95.

As in Example 2, the organic thin film was manufactured on the substrate having a three-dimensional curvature by using the organic thin film forming apparatus using the spray method according to the present invention. Accordingly, it could be confirmed that the organic thin film having a uniform thickness could be obtained as a whole, and the heating temperature of the substrate could be lowered.

EXAMPLE 3

As an organic photovoltaic (OPV) photoactive layer, PCBM (1-(3-Methoxycarbonyl)-Propyl-1-phenyl=(6,6) C61) and P3HT (Poly(3-hexylthiophene) were mixed at a ratio of 1:1 and then the mixture was dissolved in monochlorobenzene at a ratio of 0.2 wt %, to have prepared a spray solution.

The prepared solution was filtered with syringe filters of 6 um and 0.4 um, and then a nano thin film was manufactured by using the organic thin film forming apparatus of the hybrid spray method of mixing the electric spray method and the air spray method.

That is, it was set so that the applied voltage was 10 kV, the nitrogen pressure was 0.06 MPa, the distance between the spray nozzle and the substrate was 6 cm, the discharge amount was 350 ul/min, the temperature of the substrate was 130° C., and the gas temperature was 120° C. Then, the solution spray unit was made to spray the solution, and simultaneously the hot gas spray unit was made to spray the hot gas of 120° C. onto the fine liquid droplets in flight, to thereby have formed a nano organic thin film on the surface of the substrate having a three-dimensional curvature. In addition, the organic thin film sprayed on the substrate was processed for 24 hours by using a drying oven at 75° C., to thereby have carried out cross-linking.

Figure 9:
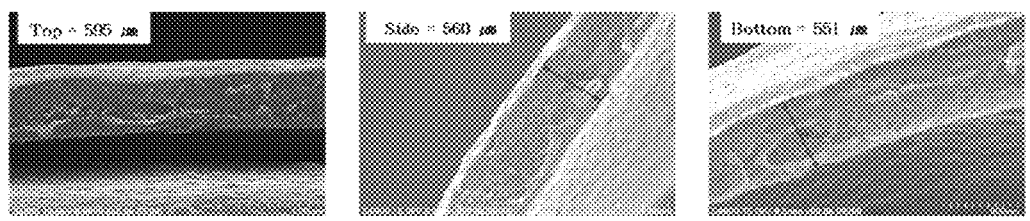
FIG. 9 shows three photos of an organic thin film prepared by Example 3 of the present invention.

As three photos shown in FIG. 9, the nano organic thin film prepared by Example 3 was taken with a scanning electron microscope, and then the thicknesses of the top, side and bottom portions of the nano organic thin film were measured, in which the thickness of the top portion was 595 nm, the thickness of the side portion was 560 nm, and the thickness of the bottom portion was 551 nm. Thus, the ratio of the top portion with respect to the bottom portion was 1.07, and the ratio of the side portion with respect to the bottom portion was 1.02.

As in Example 3, the organic thin film was manufactured on the substrate having a three-dimensional curvature by using the organic thin film forming apparatus using the spray method according to the present invention. Accordingly, it could be confirmed that the organic thin film having a uniform thickness could be obtained as a whole, and the heating temperature of the substrate could be lowered.

EXAMPLE 4

As an organic photovoltaic (OPV) photoactive layer, PCBM (1-(3-Methoxycarbonyl)-Propyl-1-phenyl=(6,6) C61) and P3HT (Poly(3-hexylthiophene) were mixed at a ratio of 1:1 and then the mixture was dissolved in chloroform at a ratio of 0.15 wt %, to have prepared a spray solution.

The prepared solution was filtered with syringe filters of 6 um and 0.4 um, and then a nano thin film was manufactured by using the organic thin film forming apparatus of the hybrid spray method of mixing the electric spray method and the air spray method.

That is, it was set so that the applied voltage was 10 kV, the nitrogen pressure was 0.06 MPa, the distance between the spray nozzle and the substrate was 6 cm, the discharge amount was 350 ul/min, the temperature of the substrate was 70° C., and the gas temperature was 90° C. Then, the solution spray unit was made to spray the solution, and simultaneously the hot gas spray unit was made to spray the hot gas of 90° C. onto the fine liquid droplets in flight, to thereby have formed a nano organic thin film on the surface of the substrate having a three-dimensional curvature. In addition, the organic thin film sprayed on the substrate was processed for 24 hours by using a drying oven at 75° C., to thereby have carried out cross-linking.

Figure 10:
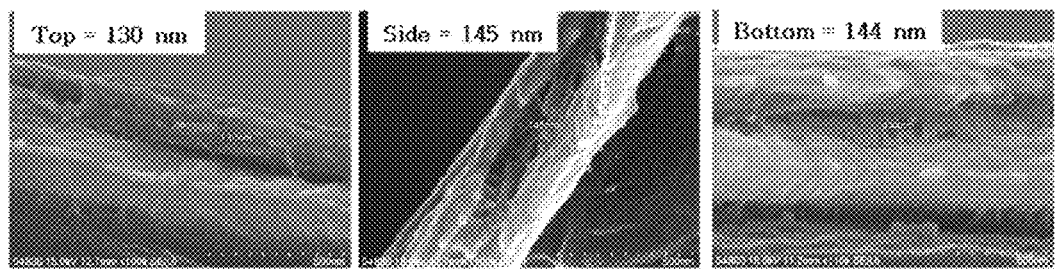
FIG. 10 shows three photos of an organic thin film prepared by Example 4 of the present invention.

As three photos shown in FIG. 10, the nano organic thin film prepared by Example 4 was taken with a scanning electron microscope, and then the thicknesses of the top, side and bottom portions of the nano organic thin film were measured, in which the thickness of the top portion was 130 nm, the thickness of the side portion was 145 nm, and the thickness of the bottom portion was 144 nm. Thus, the ratio of the top portion with respect to the bottom portion was 0.90, and the ratio of the side portion with respect to the bottom portion was 1.01.

As in Example 4, the organic thin film was manufactured on the substrate having a three-dimensional curvature by using the organic thin film forming apparatus using the spray method according to the present invention. Accordingly, it could be confirmed that the organic thin film having a uniform thickness could be obtained as a whole, and the heating temperature of the substrate could be lowered.

Figure 11:
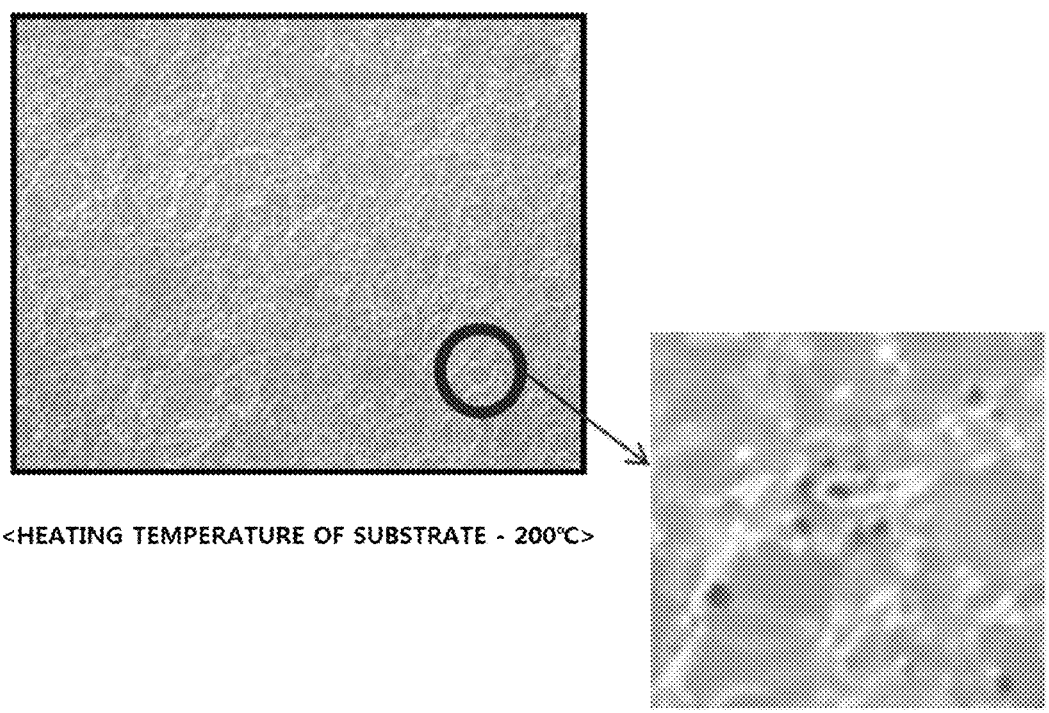
FIGS. 11 and 12 show a photograph and a partial magnification thereof, illustrating a surface of a thin film produced by an organic thin film forming apparatus of the present invention, and a thin film prepared by a conventional spray method, respectively.
Figure 12:
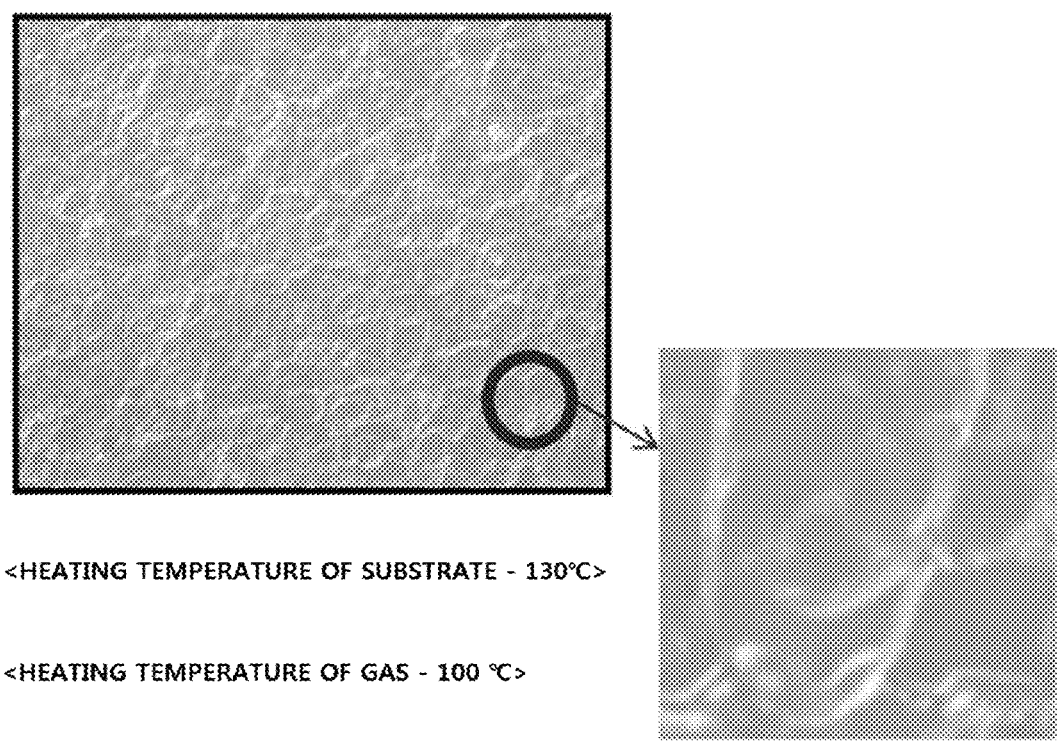

FIGS. 11 and 12 show a photograph and a partial magnification thereof, illustrating a surface of a thin film produced by an organic thin film forming apparatus of the present invention, and a thin film prepared by a conventional spray method, respectively.

As shown in FIG. 11, when the solution was sprayed on the surface of the substrate by using the conventional spray method to form an organic thin film, and the substrate was heated to 200° C. to evaporate the solvent contained in the solution, it could be confirmed that the surface of the substrate was rough and the solute was thermally damaged.

As shown in FIG. 12, as in the case of Examples 1 to 4 according to the present invention, when using the hot gas to evaporate the solvent, even if the temperature of the substrate was set to be relatively low as 130° C., it could be confirmed that the substrate surface was formed smoothly, and the solute was not thermally damaged.

As described above, the present invention has been described with respect to particularly preferred embodiments. However, the present invention is not limited to the above embodiments, and it is possible for one of ordinary skill in the art to make various modifications and variations, without departing off the spirit of the present invention. Thus, the protective scope of the present invention is not defined within the detailed description thereof but is defined by the claims to be described later and the technical spirit of the present invention.

The present invention provides an organic thin film forming apparatus, an organic thin film forming method, and a method of manufacturing an organic thin film device using the same, in which an organic light-emitting layer (photoactive layer) and/or an electron transport layer can be formed on a substrate when an organic light emitting diode (OLED) or an organic solar cell is manufactured.

The invention claimed is:

1. An organic thin film forming apparatus comprising:
a solution spray unit for spraying a solution on a substrate, the substrate being spaced apart from the solution spray unit by a predetermined distance, and the solution being formed of a solute and a solvent,
wherein the solution spray unit includes a spray nozzle connected to a solution supply unit, and the spray nozzle includes a nozzle tip formed at a leading end thereof and directed to the substrate;
a hot gas spray unit including a housing, a temperature sensor, a heating unit, a pressure sensor, and a pressure control unit,
wherein the housing surrounds the spray nozzle to form a space portion between the spray nozzle and the housing and includes a spray passage formed at a bottom thereof, and
wherein the nozzle tip passes through a center portion of the spray passage and protrudes from the bottom towards the substrate while forming an annular open passage around the nozzle tip, a hot gas being sprayed through the annular open passage, so that the hot gas in the space portion heats the solution passing through the spray nozzle, the solution being sprayed through the nozzle tip is divided into fine liquid droplets by the hot gas, and the solvent contained in fine liquid droplets is dried; and
a control unit configured in such a way that the temperature sensor measures a temperature of the hot gas being supplied into the housing, the heating unit heats the hot gas to a predetermined temperature, the pressure sensor measures a pressure of the hot gas being supplied into the housing, and the pressure control unit adjusts the pressure of the hot gas to a predetermined pressure.

2. The organic thin film forming apparatus according to claim 1, further comprising: a moving unit configured to move the spray nozzle and the housing in a direction in parallel with the substrate and in a direction towards and far away from the substrate to adjust the predetermined distance.

3. The organic thin film forming apparatus according to claim 1, wherein the hot gas spray unit further comprises: a pipe through which the hot gas is supplied into the housing, and
wherein the heating unit is installed on the pipe.

4. The organic thin film forming apparatus according to claim 1, wherein the space portion is formed between an inner surface of the housing and an outer surface of the spray nozzle.

* * * * *